United States Patent
Inoue et al.

(10) Patent No.: US 10,164,654 B2
(45) Date of Patent: Dec. 25, 2018

(54) DATA COMPRESSING DEVICE, DATA DECOMPRESSING DEVICE, AND DATA COMPRESSING/DECOMPRESSING APPARATUS

(71) Applicant: Kabushiki Kaisha Toshiba, Minato-ku, Tokyo (JP)

(72) Inventors: Kazuki Inoue, Kanagawa (JP); Keiri Nakanishi, Kanagawa (JP); Yasuki Tanabe, Kanagawa (JP); Wataru Asano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/687,780

(22) Filed: Aug. 28, 2017

(65) Prior Publication Data
US 2018/0102788 A1    Apr. 12, 2018

(30) Foreign Application Priority Data
Oct. 7, 2016 (JP) .................................. 2016-199242

(51) Int. Cl.
| H03M 7/46 | (2006.01) |
| H03M 7/30 | (2006.01) |
| H03M 7/48 | (2006.01) |
| H04L 25/06 | (2006.01) |
| H03M 7/50 | (2006.01) |
| H03M 5/14 | (2006.01) |

(Continued)

(52) U.S. Cl.
CPC .......... *H03M 7/46* (2013.01); *H03M 7/3066* (2013.01); *H03M 7/48* (2013.01); *H03M 7/607* (2013.01);
(Continued)

(58) Field of Classification Search
CPC .......... H03M 7/46; H03M 5/145; H03M 7/40; H04N 7/50; H04L 25/067
(Continued)

(56) References Cited

U.S. PATENT DOCUMENTS 5,644,305 A * 7/1997 Inoue ................ H03M 7/46
                                               341/59
5,872,529 A   2/1999 Mejia
(Continued)

FOREIGN PATENT DOCUMENTS

JP     2573849 B2    1/1997
JP     10-098721 A    4/1998
(Continued)

OTHER PUBLICATIONS

Stoimen's web log, "Computer Algorithms: Data Compression with Bitmaps," Jan. 16, 2012; http://www.stoimen.com/blog/2012/01/16/computer-algorithms-data-compression-with-bitmaps; pp. 1-4.
(Continued)

*Primary Examiner* — Joseph Lauture
(74) *Attorney, Agent, or Firm* — White & Case LLP

(57) ABSTRACT

A data compressing device according to an embodiment includes a data cutting unit configured to divide continuously inputted data into W-bit data blocks and to output the data blocks in segments such that each of the segments is composed of N data blocks, and a compression-method determining unit configured to select, as a compression portion for each of the segments, a run length system, a flag system, or no compression, according to a ratio of data blocks of specific data in any of the segments. The data compressing device further includes an RL compression unit configured to execute, on any of the segments, a run length system of storing a consecutive amount of the specific data into compressed data, and a flag compression unit configured to execute, on any of the segments, a flag system of storing positional information of the specific data into compressed data.

20 Claims, 13 Drawing Sheets

(51) Int. Cl.
  *H03M 7/40* (2006.01)
  *G06F 7/483* (2006.01)
(52) U.S. Cl.
  CPC ............ *G06F 7/483* (2013.01); *H03M 5/145* (2013.01); *H03M 7/40* (2013.01); *H03M 7/50* (2013.01); *H04L 25/067* (2013.01)
(58) Field of Classification Search
  USPC ..... 341/63, 59, 67, 51, 50; 375/340, 240.01, 375/240.03
  See application file for complete search history.

(56) References Cited

U.S. PATENT DOCUMENTS

| | | |
|---|---|---|
| 6,011,867 A | 1/2000 | Kikuchi et al. |
| 6,124,811 A | 9/2000 | Acharya et al. |
| 2011/0103703 A1 | 5/2011 | Karlov |

FOREIGN PATENT DOCUMENTS

| | | |
|---|---|---|
| JP | 2000-50271 A | 2/2000 |
| JP | 3199292 B2 | 8/2001 |
| JP | 3330013 B2 | 9/2002 |
| JP | 2005-79815 A | 3/2005 |
| JP | 3676078 B2 | 7/2005 |

OTHER PUBLICATIONS

Extended European Search Report dated Mar. 9, 2018 in counterpart European Patent Application No. 17187939.8.

\* cited by examiner

| IDENTIFIER | NUMBER OF NON-ZERO | FLAG BIT |
|---|---|---|
| I bit | | N bit |
| | Wbit | |

| SIGN | EXPONENT SECTION | FRACTION SECTION | |
|---|---|---|---|
| 0 | 0 | 0 | +0 |
| 0 | 0 | NON-ZERO | Reserved (DENORMALIZED NUMBER) |
| 1 | 0 | 0 | −0 |
| 1 | 0 | RUN LENGTH VALUE | RL (DENORMALIZED NUMBER) |
| 0 | 0x01~0x1e | ARBITRARILY DEFINED | NORMALIZED NUMBER |
| 1 | 0x01~0x1e | ARBITRARILY DEFINED | NORMALIZED NUMBER |
| 0 | 0x1f | FLAG BIT | FL (NaN) |
| 1 | 0x1f | FLAG BIT | FL (NaN) |
| 0 | 0x1f | 0 | +∞ |
| 1 | 0x1f | 0 | −∞ |
| 1 bit | 5 bit | 10 bit | |

US 10,164,654 B2

DATA COMPRESSING DEVICE, DATA DECOMPRESSING DEVICE, AND DATA COMPRESSING/DECOMPRESSING APPARATUS

CROSS-REFERENCE TO RELATED APPLICATION

This application is based upon and claims the benefit of priority from the prim Japanese Patent Application No. 2016-199242 filed on Oct. 7, 2016; the entire contents of which are incorporated herein by reference.

FIELD

Embodiments described herein relate to a data compressing device, a data decompressing device, and a data compressing/decompressing apparatus.

BACKGROUND

Data compressing/decompressing technologies for compressing amounts of data without losing contents of original data strings and for decompressing compressed data to recover original data strings have been conventionally developed. One of such technologies is a run length system. In a run length system, when identical specific data pieces consecutively appear, the data pieces are encoded using a data type and a consecutiveness length of the data in a pair, and thus, the consecutive data pieces are compressed.

In a run length system, when compressed data is decompressed with a high operating frequency, a method in which a run length value is expressed by a fixed length is generally used. However, compression efficiency in a fixed-length system may be deteriorated when the number of consecutive data pieces is considerably great or considerably small. Thus, a compressing device has been proposed which improves compression efficiency by using a plurality of formats of compressed data as appropriate according to the number of consecutive data pieces.

However, in a case where the throughput (the number of data pieces which are decompressed in one cycle) of a decompressing device needs to be ensured, analysis of a plurality of run-length data pieces in one cycle is required for data compressed by a compressing device disclosed in prior art. Accordingly, addition and comparison need to be executed many times during one cycle processing, and hence, the reduction in operating frequency becomes a problem.

DETAILED DESCRIPTION

A compressing device according to the present embodiment includes: an input-data dividing unit configured to divide continuously inputted data into data blocks each having a first bit width and outputs the data blocks by a predetermined number of the data blocks one by one as a segment; a compression-selector configured to select each of the segments, first compression means, second compression means, or non-compression means according to the ratio of data blocks of specific data with respect to the data blocks included in the segment; a first compression unit configured to execute, on any of the segment in plurality, the first compression means of storing a consecutive amount of the specific data into compressed data; and a second compression unit configured to execute, on any of the segments, the second compression means of storing positional information of the specific data into compressed data, wherein the compressed data compressed in accordance with the means selected by the compression-selector has an identification bit from which the compression means can be identified.

Hereinafter, embodiments are described with reference to the drawings.

First Embodiment

Figure 1:
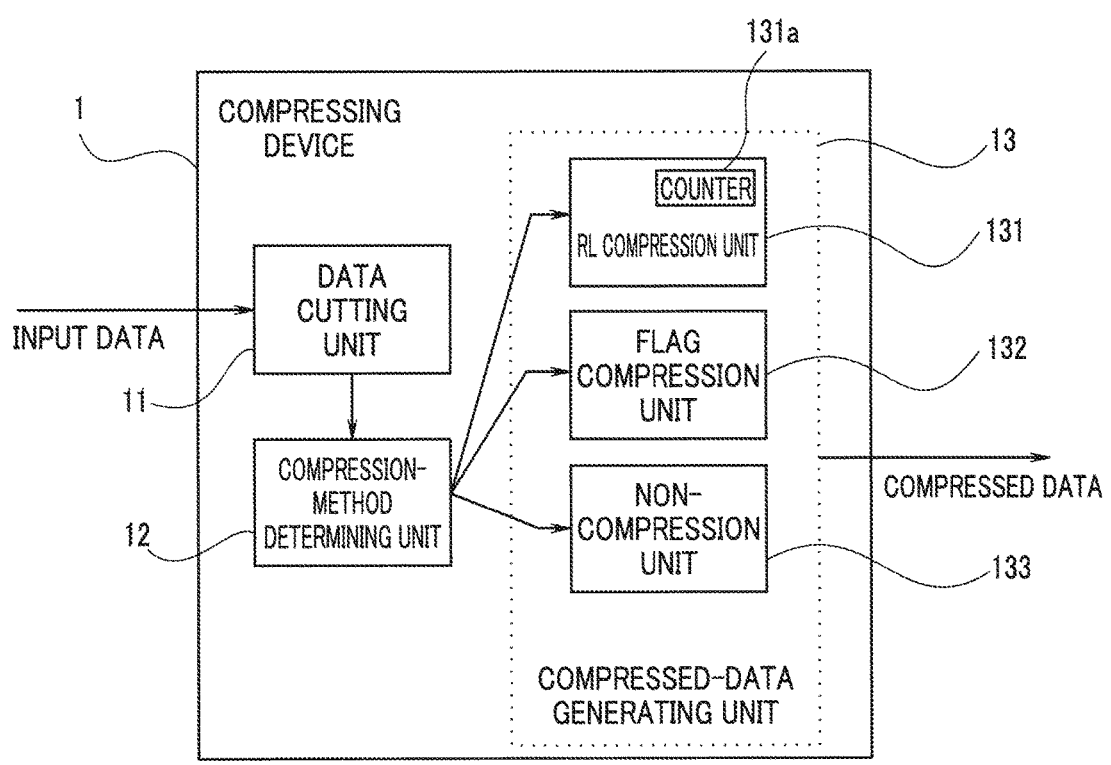
FIG. 1 is an explanatory schematic block diagram of a configuration of a compressing device according to a first embodiment.

FIG. 1 is an explanatory diagram of the configuration of a compressing device according to a first embodiment. A compressing device 1 receives input data, generates compressed data, and outputs the compressed data. The compressing device 1 takes out data blocks, which are obtained by sectioning the input data to W bit each, N by N from the input data. N data blocks are defined as one segment, and the compressing device 1 generates compressed data by using a predetermined compression method for each segment and outputs the compressed data. Note that the compressing device 1 compresses specific data which is set in advance. A description is given below of a case where "0" is set as the specific data and data blocks obtained by sectioning data to 16 bits (W=16) each, are taken out four by four (N=4) to be compressed.

The compressing device 1 is configured by including a data cutting unit 11, a compression-method determining unit 12, and a compressed-data generating unit 13.

The data cutting unit 11 takes out data to be compressed from the input data. Compression is executed on each segment. Accordingly, the data cutting unit 11 cuts out the input data into N×W-bit data pieces, each of which is defined as one data segment, from the head of the input data. The cut-out data is outputted to the compression-method determining unit 12.

The compression-method determining unit (compression-selector) 12 determines a method for compressing one inputted data segment. The compressing device 1 executes compression on each segment by using any one of (1) a run length system, (2) a flag system, and (3) a method involving no compression (non-compression). The compression method is determined as follows.

When all of N data blocks are "0", the run length system is selected. When the number of data blocks "0" is not less than one but less than N, the flag system is selected. When all of N data blocks have values other than "0", the non-compression is selected. The selected compression method and the data to be compressed are outputted to the compressed-data generating unit 13.

The compressed-data generating unit 13 is configured by an RL compression unit (first compression unit) 131, a flag compression unit (second compression unit) 132, and a non-compression unit 133. One segment of data to be compressed is inputted to any one of the RL compression unit 131, the flag compression unit 132, and the non-compression unit 133, according to the selected compression method, and is converted into compressed data. The compressed data is outputted.

Figure 2A:
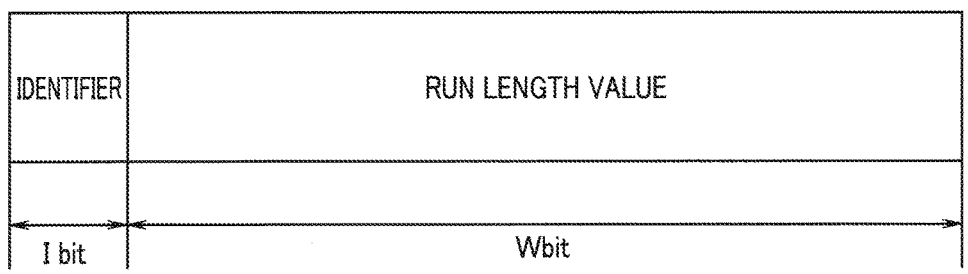
FIGS. 2A to 2C are explanatory diagrams of compressed data formats.
Figure 2B:
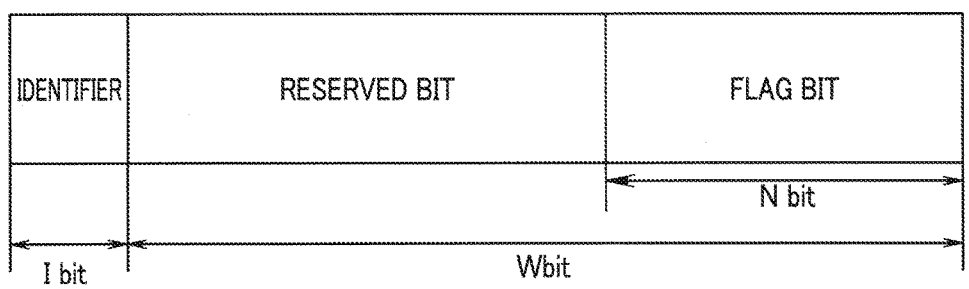
Figure 2C:
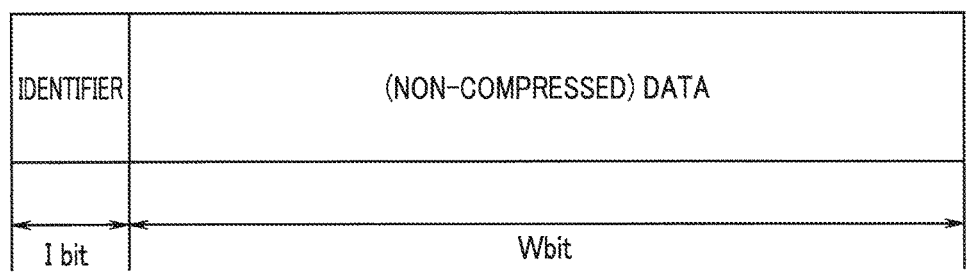

FIGS. 2A to 2C are explanatory diagrams of compressed data formats. FIG. 2A shows a data format of data compressed by the run length system, FIG. 2B shows a data format of the head field of data compressed by the flag system, and FIG. 2C shows a data format of non-compressed data.

An identifier is given to the head of each of the data formats. The identifier indicates whether the data is compressed by the run length system, is compressed by the flag system, or is non-compressed data. For example, the identifier "1" is set for data by the run length system, the identifier "2" is set for data by the flag system, and the identifier "3" is set for non-compressed data.

Data compressed by use of the run length system (first compression means) indicates a run length value which represents the number of consecutive segments compressed by the run length system. For example, when all of the data blocks included in three consecutive segments are "0", the run length value is "3". The compressed data is generated by adding an I-bit identifier to the head of the W-bit run length value, and is outputted as an I+W-bit fixed length field.

Data compressed by use of the flag system (second compression means) is generated by adding a data block having a value other than "0" to the head field of the format shown in FIG. 2B. In the head field, an identifier for identifying a compression method is given to the head of a flag bit. In the flag bit, a bit "1" is set at the position of a data block having a value "0" so that the positional information of data "0" is recorded. Accordingly, the flag bit is expressed by N bit which is equal to the number of data blocks included in one segment. In the head field, a (W−N)-bit reserved bit section and an I-bit identifier are added before the N-bit flag bit, so that an I+W-bit fixed length field is generated. Further, an I-bit adjustment bit is added to the head of each of data blocks each having a value other than "0", so that an I+W-bit fixed length field is generated.

For example, when the values of data blocks of a certain segment are "1", "0", "2", and "0" in order, the flag bit shows "0101". In addition, the data blocks "0" are removed and the data blocks "1" and "2" are added after the head field.

When the non-compression is selected, I-bit identifiers are added to respective W-bit data blocks of one data segment, and the resultant data is outputted. That is, data compressed by any of the systems is generated by adding an I-bit identifier to the head of W-bit data, and is outputted as an I+W-bit fixed length field.

The RL compression unit 131 includes a counter 131a that counts a run length value. When the run length system is selected as a compression method, the compression-method determining unit 12 inputs target data to the RL compression unit 131 and increments the counter 131a. When determining the flag system or the non-compression as the compression method for a next segment, the compression-method determining unit 12 instructs the RL compression unit 131 to output compressed data. The RL compression unit 131 generates compressed data of a format using a run length value and outputs the compressed data.

When receiving input of one data segment from the compression-method determining unit 12, the flag compression unit 132 generates and outputs the head field of a format. Subsequently to the head field, the flag compression unit 132 generates compressed data by removing a data block "0" from the inputted data and adding an I-bit adjustment bit to each of the heads of data, and outputs the compressed data.

When receiving input of one data segment from the compression-method determining unit 12, the non-compression unit 133 adds an I-bit identifier to the head of each of the data blocks and outputs the resultant data.

Figure 3:
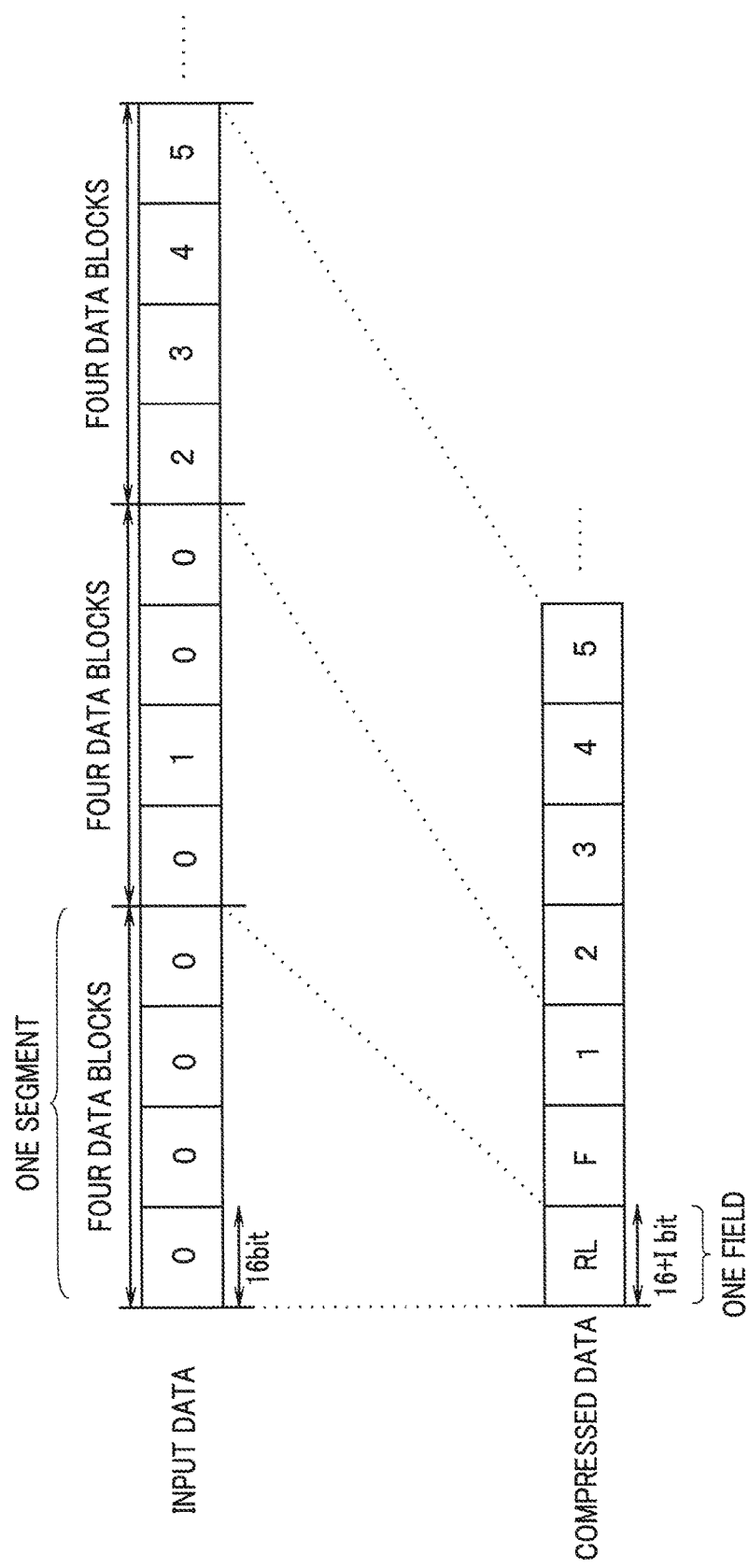
FIG. 3 is an explanatory diagram of respective data structures of input data and compressed data.

FIG. 3 is an explanatory diagram of respective data structures of input data and compressed data. FIG. 3 shows a case where four 16-bit data blocks are defined as one segment and compression is executed on each segment. Since all the values of data blocks in the first segment of the input data are "0", the segment is compressed by the run length system. Since the value of the second data block in a next segment is a value "1" and the values of the other data blocks are "0", the segment is compressed by the flag system. Since all the values of data blocks in the last segment are other than "0", the segment is subjected to the non-compression.

Consequently, as data obtained by compressing the first segment, a 16+I-bit field having a run length value of 1 is outputted. That is, four 16-bit data blocks are compressed into one 16+I-bit field through run-length compression and the 16+I-bit field is outputted.

As data obtained by compressing the second segment, a 16+I-bit head field including a 4-bit flag bit "1011" is outputted. Subsequently, a data block having a value of "0" is removed from the segment and a data block having a value of "1" is left. Accordingly, a 16+I-bit field obtained by adding an I-bit adjustment bit to the head of the data block "1" is outputted. That is, four 16-bit data blocks are compressed by the flag system, and accordingly, two 16+I-bit fields are outputted.

Since the third segment is subjected to the non-compression, four 16+I-bit fields each obtained by adding an I-bit identifier to the head of each of the data blocks are outputted.

Figure 4:
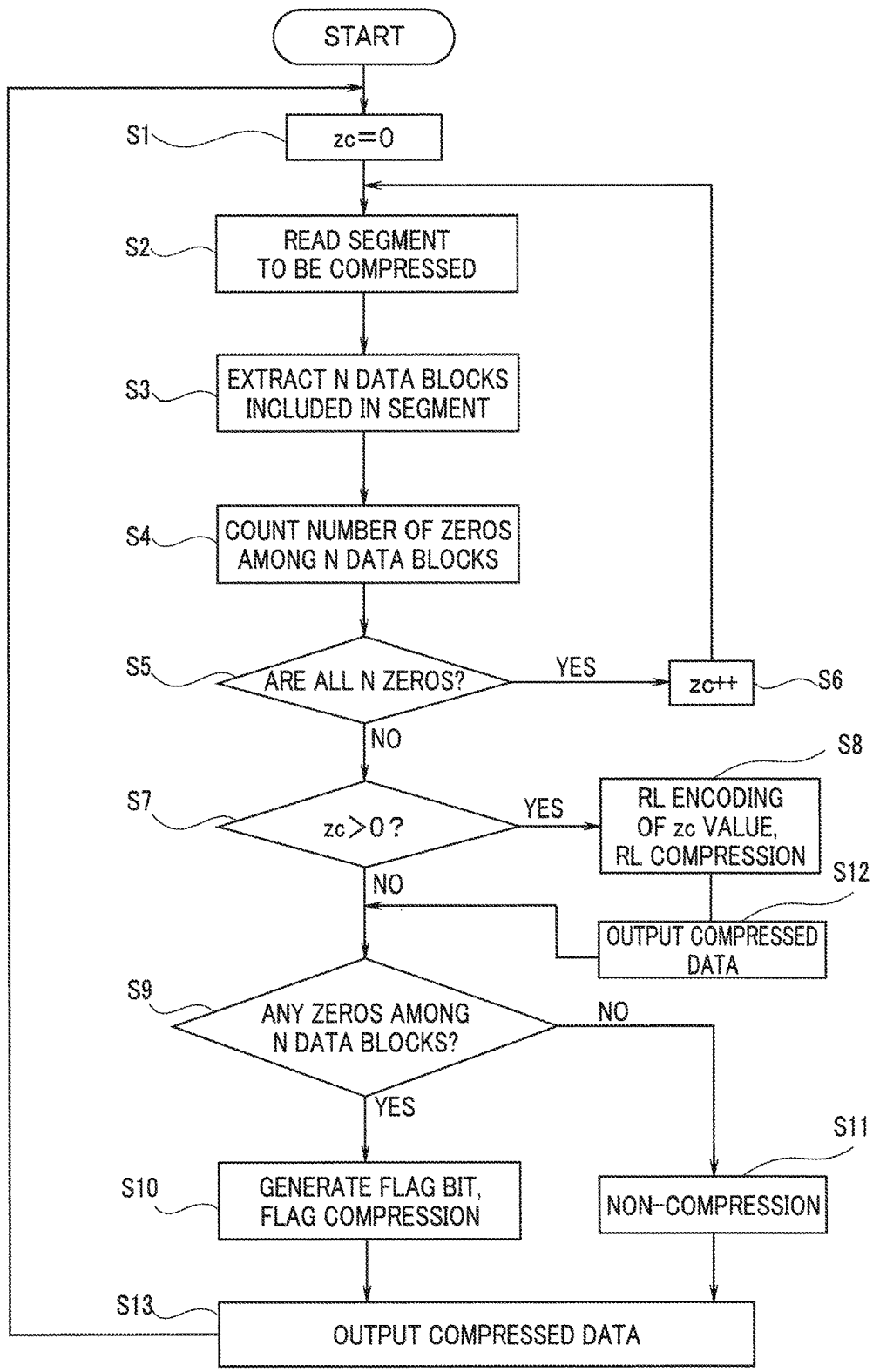
FIG. 4 is a flowchart showing an operation of the compressing device according to the first embodiment.

Next, an operation of the compressing device according to the present embodiment is described. FIG. 4 is a flowchart showing an operation of the compressing device according to the first embodiment. Note that it is assumed that a value as specific data to be compressed is registered in the compressing device before compression is executed. A description is given below of a case where "0" is registered as the specific data.

First, the value of the counter 131a is cleared to zero (zc=0 at S1). Next, one segment of input data is read into the compressing device 1 (S2). The data cutting unit 11 cuts out N data blocks configuring the one segment of data, and outputs the N data blocks to the compression-method determining unit 12 (S3).

The compression-method determining unit 12 counts the number of data blocks each having a value of "0" among the N data blocks (S4). When all of the N data blocks are "0" (YES at S5), the RL compression unit 131 increments the value of the counter 131a by one. Subsequently, the compressing device 1 returns to S2, and reads a next segment of the input data.

In contrast, a data block having a value other than "0" is included in the N data blocks (NO at S5), the value of the counter 131a is checked. When the value of the counter 131a is greater than zero (YES at S7), the RL compression unit 131 compresses, by the run length system, a segment of data which has been read but is left uncompressed. That is, the RL compression unit 131 generates compressed data having a run length value which is equal to the value of the counter 131a (S8), and outputs the compressed data (S12). Next, the operation proceeds to S9, and determination of a compression method for the current input data is continued.

When the value of the counter 131a is "0" (NO at S7), whether or not a data block having a value of "0" exists among the N data blocks is determined (S9). When a data block having a value of "0" exists (YES at S9), the flag compression unit 132 creates a flag bit from the data of the segment, executes flag compression (S10), and outputs the compressed data (S13).

In contrast, when no data block having a value of "0" exists (NO at S9), the non-compression unit 133 executes non-compression processing (in which an identifier for indicative of non-compressed data is given to the head of the data) (S10), and outputs the resultant data as compressed data (S13).

After output of the compressed data is completed, the operation returns to S1 to clear the counter 131a to zero, and then, a next segment of the input data is read. In this way, until input of data to the compressing device 1 is ended, the operation sequence of S1 to S13 is repeated, so that the compressed data is generated and outputted.

Figure 5:
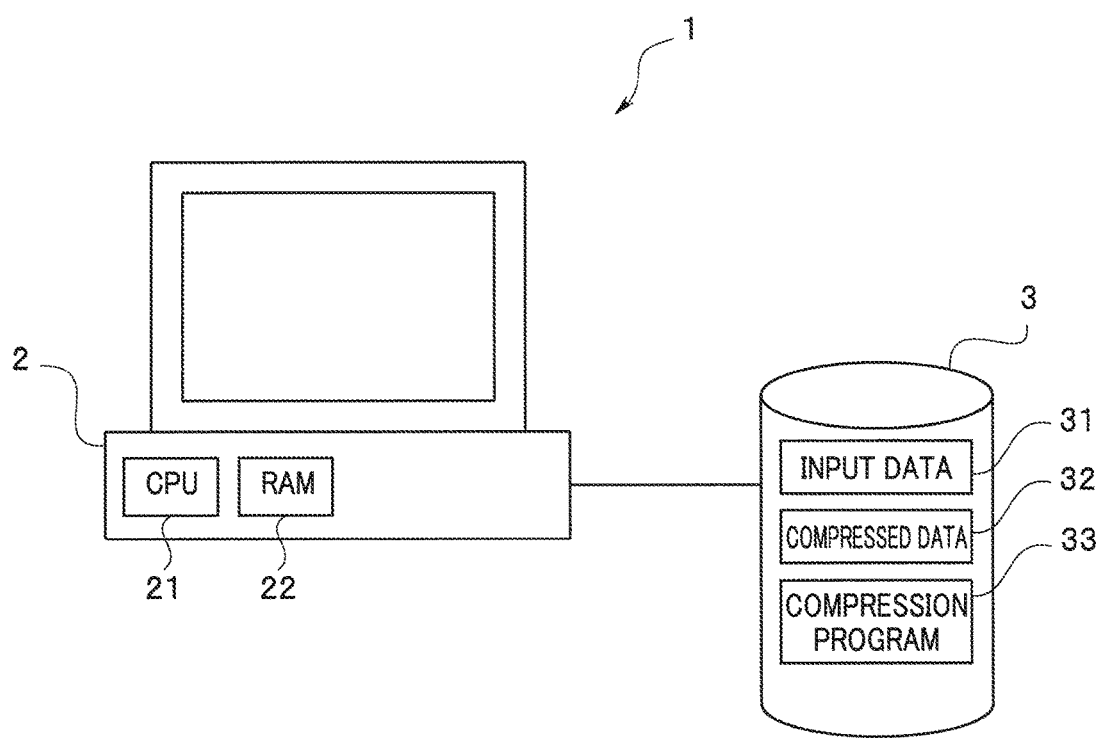
FIG. 5 is an explanatory diagram of another configuration of the compressing device according to the first embodiment.

Note that, although FIG. 1 illustrates the case where the compressing device is realized on hardware, the compressing device may be realized by use of software. FIG. 5 is an explanatory diagram of another configuration example of the compressing device according to the first embodiment. When the compressing device is realized by software, a compression program 33 in which compression operations are written is registered in a database 3. When data compression is executed, the compression program 33 is read into a RAM 22 of a PC 2. Subsequently, input data 31 is read from the database 3 into the PC 2, the compression program 33 is executed by a CPU 21, and thereby, compressed data 32 is generated.

Note that, although the input data 31, the compressed data 32, and the compression program 33 in the configuration in FIG. 5 are stored in the same database 3, the input data 31, the compressed data 32, and the compression program 33 may be stored in different databases. In addition, the input data 31 and the compressed data 32 may be inputted/outputted directly to/from another device, without being stored in the database 3.

Figure 6:
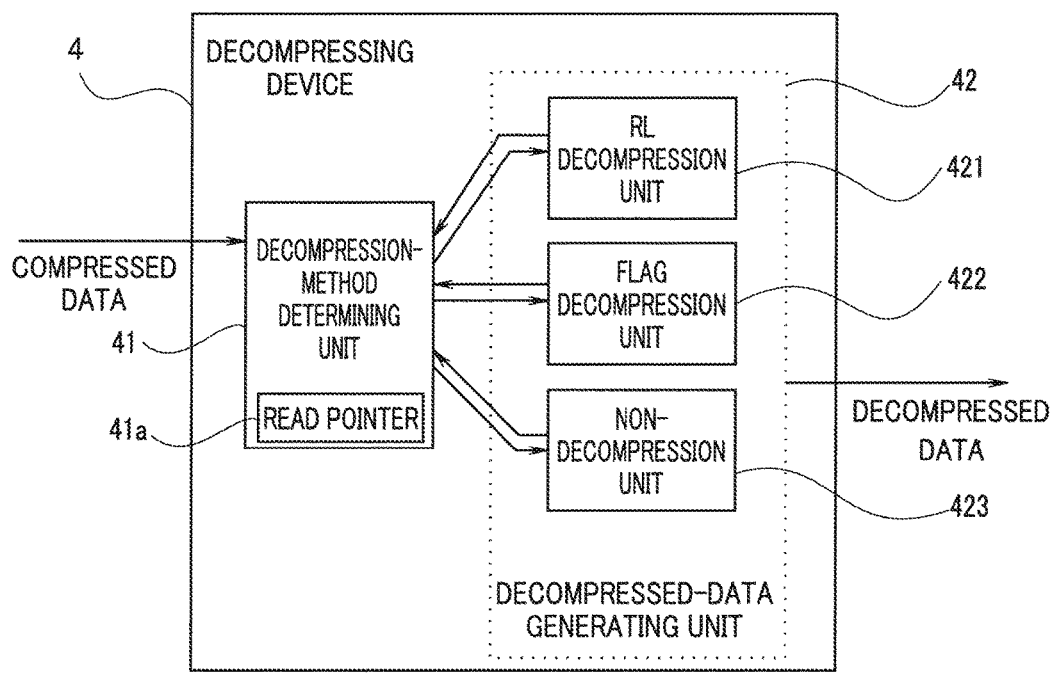
FIG. 6 is a schematic block diagram of the configuration of a decompressing device according to the first embodiment.

Next, a decompressing device 4 configured to decompress compressed data generated by use of the compressing device 1 is described. FIG. 6 is an explanatory diagram of the configuration of a decompressing device according to the first embodiment. The decompressing device 4 receives the compressed data, generates decompressed data, and outputs the decompressed data. The decompressing device 4 decompresses the compressed data in units of fields outputted at every (I+W) bit, and outputs the decompressed data in units of W-bit data blocks.

The decompressing device 4 is configured by including a decompression-method determining unit (decompression-selector) 41 and a decompressed-data generating unit 42. The decompression-method determining unit 41 determines a method for decompressing inputted compressed data. As such compressed data, any of three types of data compressed by (1) the run length system, (2) the flag system, or (3) the non-compression is inputted. Each of the fields has an I-bit identifier, which indicates the compression method, given to the head of the field. Accordingly, the decompression-method determining unit 41 determines a decompression method by analyzing the identifier. Note that the decompression-method determining unit 41 includes a read pointer 41a for pointing at the position of a field for which a decompression method is to be determined.

The decompressed-data generating unit 42 is configured by an RL decompression unit (first decompression unit) 421, a flag decompression unit (second decompression unit) 422, and a non-decompression unit 423. One field of the compressed data is inputted to any one of the RL decompression unit 421, the flag decompression unit 422, and the non-decompression unit 423 according to the decompression method selected by the decompression-method determining unit 41, and is converted into decompressed data to be outputted.

In the decompression-method determining unit 41, when the identifier of a field pointed at by the read pointer 41a is determined to indicate the run length system, the field is inputted into the RL decompression unit 421. The RL decompression unit 421 generates decompressed data on the basis of a run length value stored in the field. That is, specific data is outputted such that the number of pieces of the specific data is equal to the number of segments represented by the run length value. For example, when the run length value is 3, three segments×four data blocks=twelve "0"s are outputted. The decompression-method determining unit 41 advances the read pointer 41a by the number of fields (=one field) used for the decompression.

In the decompression-method determining unit 41, when the identifier of the field is determined to indicate the flag system, the field is inputted into the flag decompression unit 422. The flag decompression unit 422 analyzes a flag bit stored in the field and determines the number of fields to be used for decompression. That is, in the flag system, data at the position of a flag bit "1" is compressed but data at the position of a flag bit "0" is added without being compressed. Accordingly, in addition to the head field in which the flag bit is stored, fields of data which are added without being compressed is used to execute decompression.

For example, when a flag bit shows "0101", the number of fields to be used for decompression is 1 (head field)+2 (the number of flag bits "0")=3. The flag decompression unit 422 requests the same number of fields as the number of flag bits "0", from the decompression-method determining unit 41. Further, the decompression-method determining unit 41 advances the read pointer 41a by the number of fields used for the decompression.

The decompression-method determining unit 41 outputs the requested number of fields to the flag decompression unit 422. In accordance with the flag bit stored in the head field, the flag decompression unit 422 outputs "0" when the flag bit shows "1", and outputs the value of a subsequent field when the flag bit shows "0".

For example, when a flag bit shows "0101" and subsequent fields inputted as compressed data are "2" and "3", four data blocks "2", "0", "3", and "0" are outputted as decompressed data.

In the decompression-method determining unit 41, when the identifier is determined to indicate the non-compression, the field is inputted into the non-decompression unit 423. The non-decompression unit 423 deletes the I-bit identifier at the head, and outputs the resultant data as W-bit decompressed data. The decompression-method determining unit 41 advances the read pointer 41a by the number of fields (=N fields) used for the processing.

That is, the decompressing device 4 according to the present embodiment can determine a decompression method and the number of fields to be used for one cycle decompression, by checking the fields of compressed data. Therefore, unlike the conventional devices, the decompressing device 4 does not need to execute addition of or comparison among a plurality of fields by checking the fields, and thus, can execute decompression processing with a high operating frequency.

Figure 7:
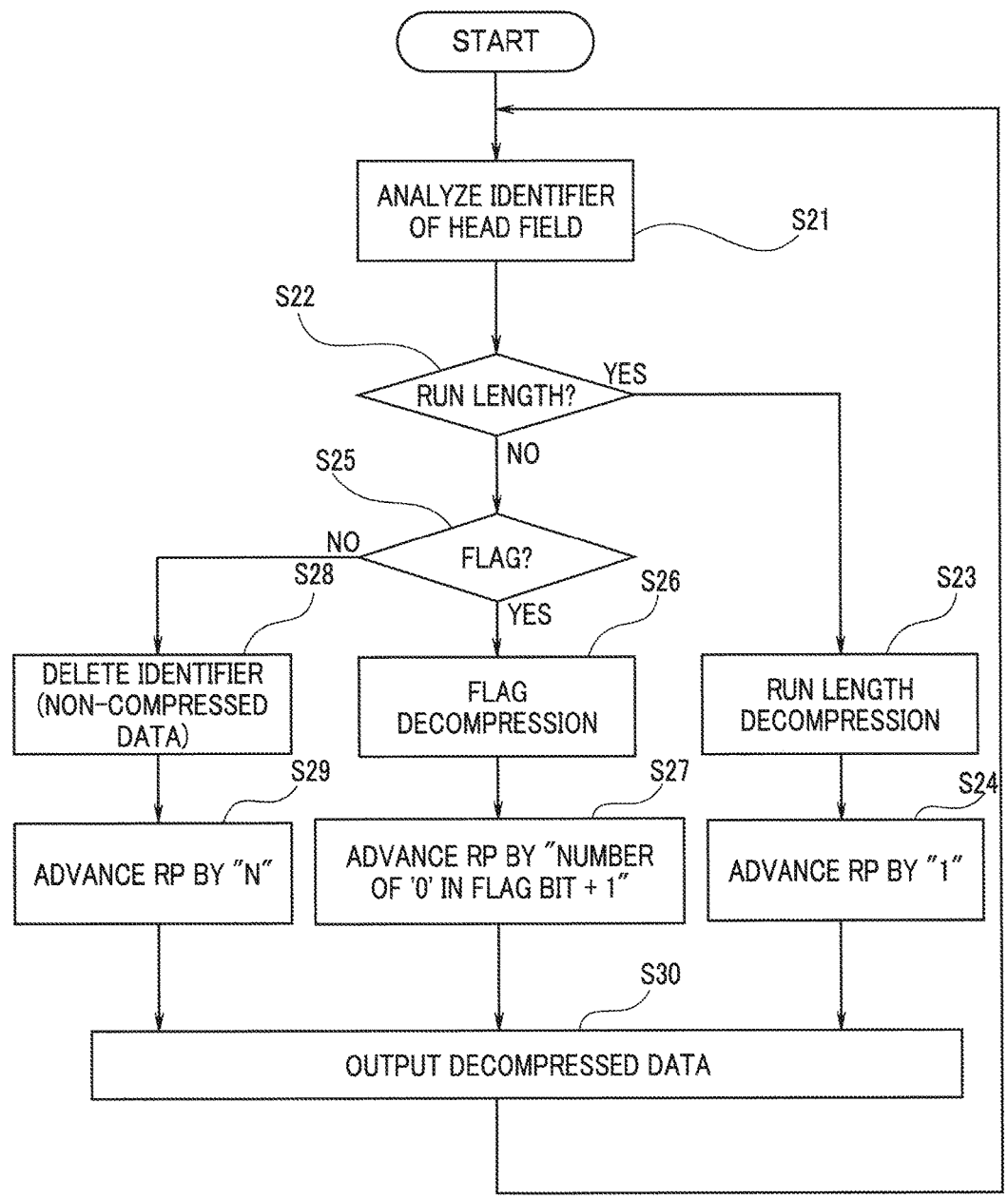
FIG. 7 is a flowchart showing an operation of the decompressing device according to the first embodiment.

Next, an operation of the decompressing device according to the present embodiment is described. FIG. 7 is a flowchart of an operation of the decompressing device according to the first embodiment. Note that it is assumed that a value as specific data to be decompressed is registered in the decompressing device before data decompression is executed. In addition, it is assumed that the read pointer 41a points at the head field of inputted compressed data. A description is given below of a case where "0" is registered as the specific data.

First, the read pointer 41a is checked, a field of compressed data is read, and the identifier added to the field is analyzed (S21). When the identifier indicates the run length system (YES at S22), the field is run-length-decompressed at the RL decompression unit 421 (S23). The decompression-method determining unit 41 advances the read pointer 41a by one (S24), and outputs the decompressed data (S30).

When the identifier is determined not to indicate the run length system (NO at S22), whether or not the identifier indicates the flag system is determined (S25). When the identifier is determined to indicate the flag system (YES at S25), the flag decompression unit 422 executes flag bit analysis on the field, requests a field required for flag decompression from the decompression-method determining unit 41, and executes flag decompression (S26). In addition, the decompression-method determining unit 41 advances the read pointer 41a by the number of fields (the number of flag bits "0"+1) used for the flag decompression (S27), and outputs the decompressed data (S30).

When the identifier is determined not to indicate the flag system (NO at S25), the data is determined to be non-compressed data. The non-decompression unit 423 deletes the I-bit identifier at the head of the field and generates decompressed data (S28). The decompression-method determining unit 41 advances the read pointer 41a by N (S29), and outputs the decompressed data (S30).

After the decompressed data is outputted from any of the RL decompression unit 421, the flag decompression unit 422, and the non-decompression unit 423 (S30), the operation returns to S21, and a field pointed at by the read pointer 41a is analyzed. In this way, until input of data to the decompressing device 4 is ended, the operation sequence of S21 to S30 is repeated, so that the decompression data is generated and outputted.

Note that, although the case where the decompressing device is realized on hardware has been described above, the decompressing operation shown in FIG. 7 may be realized by use of software, as in the compressing device.

According to the present embodiment as described above, data compression is executed on each segment composed of N data blocks. As a result of giving an identifier indicating a compression method to the head of compressed data, a decompression method and the number of fields to be used in one-cycle decompression can be determined by checking fields of the compressed data during decompression of the compressed data. Therefore, unlike the conventional devices, addition of or comparison among a plurality of fields by checking the fields are not needed, and thus, decompression processing can be executed with a high operating frequency. However, a run length value is limited to multiples of N because run-length compression is executed on each segment. This may lower the compression efficiency. However, according to the present embodiment, the flag system is used together with the run length system, and thus, specific data which is a fraction also can be compressed. Accordingly, lowering of compression efficiency can be prevented.

Figures 8, 9:
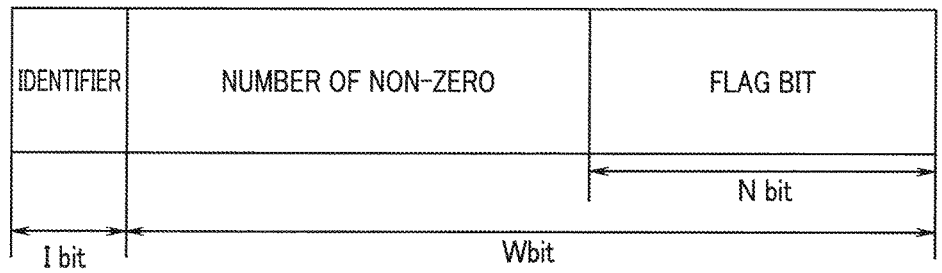
FIG. 8 is an explanatory diagram of a compressed data format according to a modification of the first embodiment.
FIG. 9 is an explanatory diagram of a compressed data format according to another modification of the first embodiment.

Note that the format of compressed data is not intended to be limited to the format shown in FIG. 2, and various modifications of the format can be made as long as a field has a fixed length and a compression method can be identified by checking a particular position. FIG. 8 is an explanatory diagram of a compressed data format according to a modification of the first embodiment. FIG. 8 shows one example of a data format of a head field obtained by the flag system.

In the present modification, the number of non-zero data blocks is stored in a (W−N)-bit reserved bit section in the head field compressed by the flag system shown in FIG. 2B. Accordingly, when data compressed by the flag system is decompressed, the number of fields to be used for the decompression can be specified by checking the number of non-zero data blocks and adding 1 (=the head field) to the number of non-zero data blocks. Since analysis of a flag bit and calculation of the number of fields are not needed, decompression processing can be executed with a higher operating frequency.

Note that the number obtained by adding 1 to the number of non-zero in a flag bit may be stored in a reserved bit section. In this case, the number stored in reserved bit section is equal to the number of fields required for decompression. Thus, when the number of fields required for decompression is specified, addition processing is not needed. This allows processing to be performed with a higher operating frequency.

FIG. 9 is an explanatory diagram of a compressed data format according to another modification of the first embodiment. FIG. 9 shows one example of formats of compressed data obtained by compressing input data that has a format using IEEE754 half-precision floating-point expression. In a case where the format of input data, such as IEEE754, is defined in advance, a compression system is allocated to a specific bit pattern so that the compression system can be identified.

In a data format using IEEE754 half-precision floating-point expression, 1 bit at the head of a 16-bit data block is allocated to a sign section, the following 5 bit are allocated to an exponent section, and the last 10 bit are allocated to a fraction section. A denormalized number, a normalized number, "±0", NaN, "±∞" are expressed to be distinguished from one another, by means of combination of the sign section, the exponent section, and the fraction section. For example, in a case where non-use of a denormalized number and NaN is intended (a denormalized number and NaN are not used as input data), the run length system and the flag system are allocated to patterns for the denormalized number and NaN.

For example, data compressed by the run length system is allocated to a pattern (the sign section: 1, the exponent section: 0, the fraction section: a value other than 0) representing a denormalized number, and data compressed by the flag system is allocated to a pattern (the sign section: 0 or 1, the exponent section: 0x1f, the fraction section: an arbitrarily value other than 0) representing NaN. For data compressed by the run length system, a run length value is stored in the fraction section. For data compressed by the flag system, a flag bit (or the number of fields to be used at a time of decompression and a flag bit) is stored in the fraction section.

In this case, when 6 bit at the head of a field are checked to find out that the sign section=1 and the exponent section=0, the field is determined to be compressed data using the run length system. In addition, when the second and later bit of a field are checked to find out that the exponent section=0x1f and the fraction section: non-zero, the field is determined to be compressed data using the flag system. Accordingly, since adding an identifier to the head of compressed data is not needed, each of the bit widths of the compressed data remains to be equal to the bit width (=W bit) of input data. Therefore, the compression efficiency is improved.

Note that as long as a data format of input data is defined in advance, a format other than IEEE754 may be used. A character code such as an ASCII code may be used in the format. In ASCII codes, alphabets, numerals, symbols, and the like are each identified and expressed by 8 bits. For example, when non-use of" is intended ("is not used as input data), the run length system or the flag system can be allocated to a symbol pattern.

Second Embodiment

In the compressing device according to the first embodiment, the compression-method determining unit determines which of the run length system, the flag system, and non-compression is used for executing compression, and input data is distributed to any one of the compression units. On the other hand, in a compressing device according to a second embodiment, a first compressor compresses input data by the run length system, and next, a second compressor compresses the input data by the flag system. That is, the second embodiment differs from the first embodiment in that two-stage compression is executed.

Figure 10:
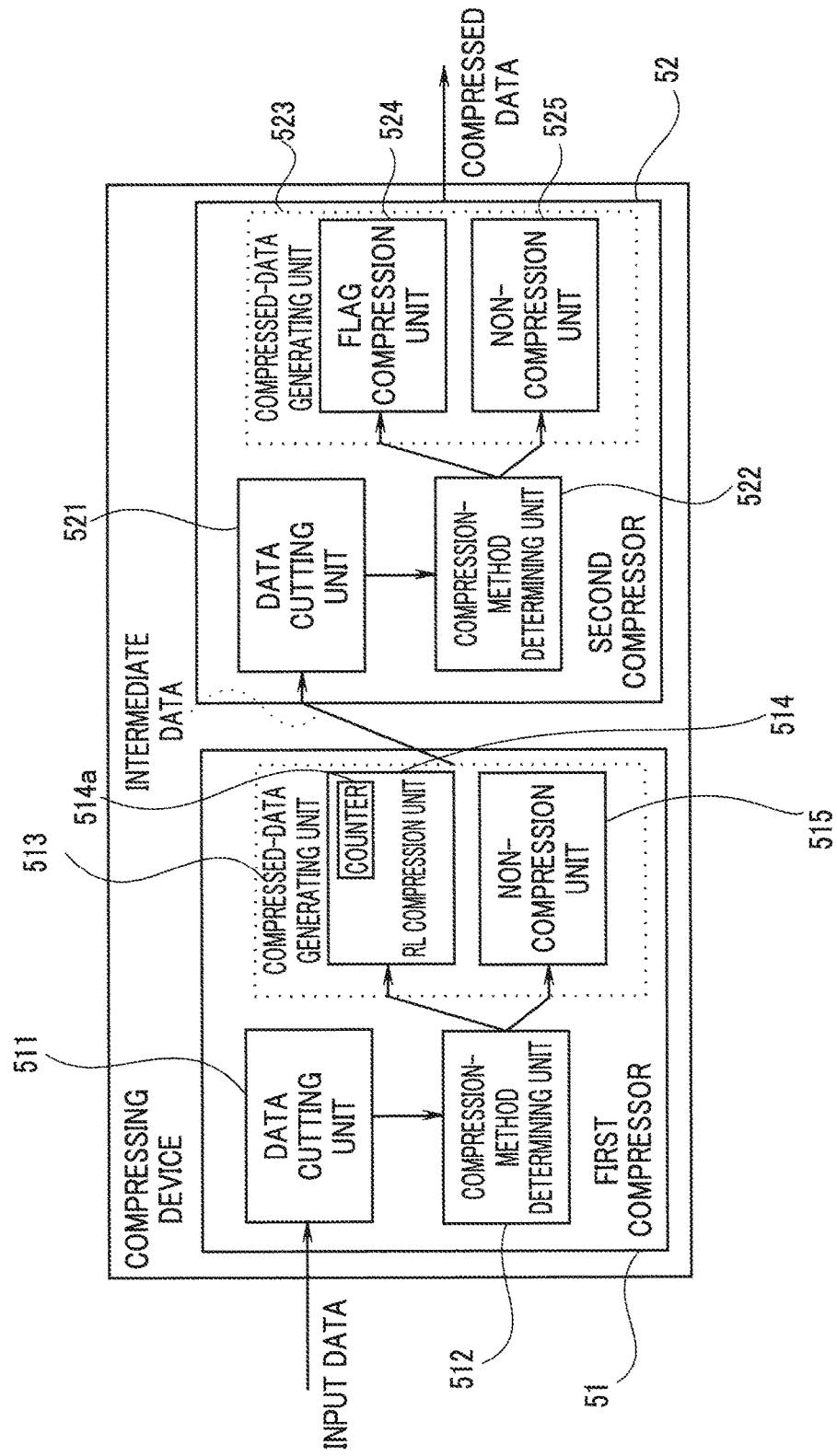
FIG. 10 is a schematic block diagram of the configuration of a compressing device according to a second embodiment.

FIG. 10 is an explanatory diagram of the configuration of the compressing device according to the second embodiment. A compressing device 5 is configured by a first compressor 51 and a second compressor 52. The first compressor 51 receives input data, generates intermediate data, and outputs the intermediate data to the second compressor 52. The second compressor 52 generates compressed data from the intermediate data and outputs the compressed data.

The compressing device 5 takes out data blocks sectioned at every W bit from input data, N by N. N data blocks are defined as one segment, each segment is compressed by the run length system, and intermediate data is generated and outputted. Next, symbols sectioned at every W+I bit are taken out from the intermediate data, N by N. N symbols are defined as one segment, each segment is compressed by the flag system or is subjected to the non-compression, and compressed data is generated and outputted. The compressing device according to the present embodiment compresses specific data which is set in advance. A description is given below of a case where "0" is set as the specific data, 16-bit (W=16) sectioned data blocks are taken out from the input data four by four (N=4) so as to be compressed.

The first compressor 51 is configured by including a data cutting unit 511, a compression-method determining unit 512, and a compressed-data generating unit 513. The compressed-data generating unit 513 is configured by including an RL compression unit 514 and a non-compression unit 515. In addition, the second compressor 52 is configured by including a data cutting unit 521, a compression-method determining unit 522, and a compressed-data generating unit 523. The compressed-data generating unit 523 is configured by including a flag compression unit 524 and a non-compression unit 525.

The data cutting unit 511 takes out data to be compressed from the input data. Since compression is executed on each segment, the data cutting unit 511 cuts out N×W-bit pieces from the head of the input data such that each of N×W-bit pieces is defined as one data segment. The cut-out data is outputted to the compression-method determining unit 512.

The compression-method determining unit 512 determines whether or not one segment of the input data is to be compressed by the run length system. When all of N data blocks are "0", it is determined that the segment can be compressed by the run length system. When it is determined that the segment can be compressed by the run length system, N symbols are outputted to the RL compression unit 514. In contrast, when it is determined that the segment cannot be compressed by the run length system, the segment is outputted to the non-compression unit 515.

The RL compression unit 514 includes a counter 512a that counts a run length value. When determining that the segment can be compressed by the run length system, the compression-method determining unit 512 increments the counter 512a. When determining that a next segment of the input data cannot be compressed by the run length system, the compression-method determining unit 512 instructs the RL compression unit 514 to output compressed data. The RL compression unit 514 generates compressed data of the format shown in FIG. 2A by using a run length value, and outputs the compressed data as intermediate data.

When one segment of data is inputted from the compression-method determining unit 512 to the non-compression unit 515, the non-compression unit 515 adds an I-bit adjustment bit (for example, "0") to the head of each of the data blocks and outputs the resultant data as intermediate data.

The data cutting unit 521 takes out data to be compressed from the intermediate data. Since compression is executed on each segment, the data cutting unit 521 cuts out N×(W+I)-bit pieces from the head of the intermediate data such that each of N×(W+I)-bit pieces is defined as one data segment. The cut-out data is inputted to the compression-method determining unit 522.

The compression-method determining unit 522 determines whether or not one segment of the intermediate data is to be compressed by the flag system. When the number of symbols "0" of the segment is equal to or greater than one but less than N, it is determined the segment can be compressed by the flag system. When it is determined that the segment can be compressed by the flag system, the N symbols are outputted to the flag compression unit 524. In contrast, when it is determined that the segment cannot be compressed by the flag system, the segment is outputted to the non-compression unit 525.

When one data segment is inputted from the compression-method determining unit 522 to the flag compression unit 524, the flag compression unit 524, similarly to the flag compression unit 132 according to the first embodiment, generates and outputs a head field of the format shown in FIG. 2B. Subsequent to the head field, the flag compression unit 524 generates compressed data by removing a data block "0" from the inputted data, and outputs the compressed data. Note that the head field may have the format shown in FIG. 8.

When one segment of data is inputted from the compression-method determining unit 522 to the non-compression unit 525, the non-compression unit 525 changes I bit at the head of the segment to an identifier identifying the non-compression, and outputs the resultant data.

Figure 11:
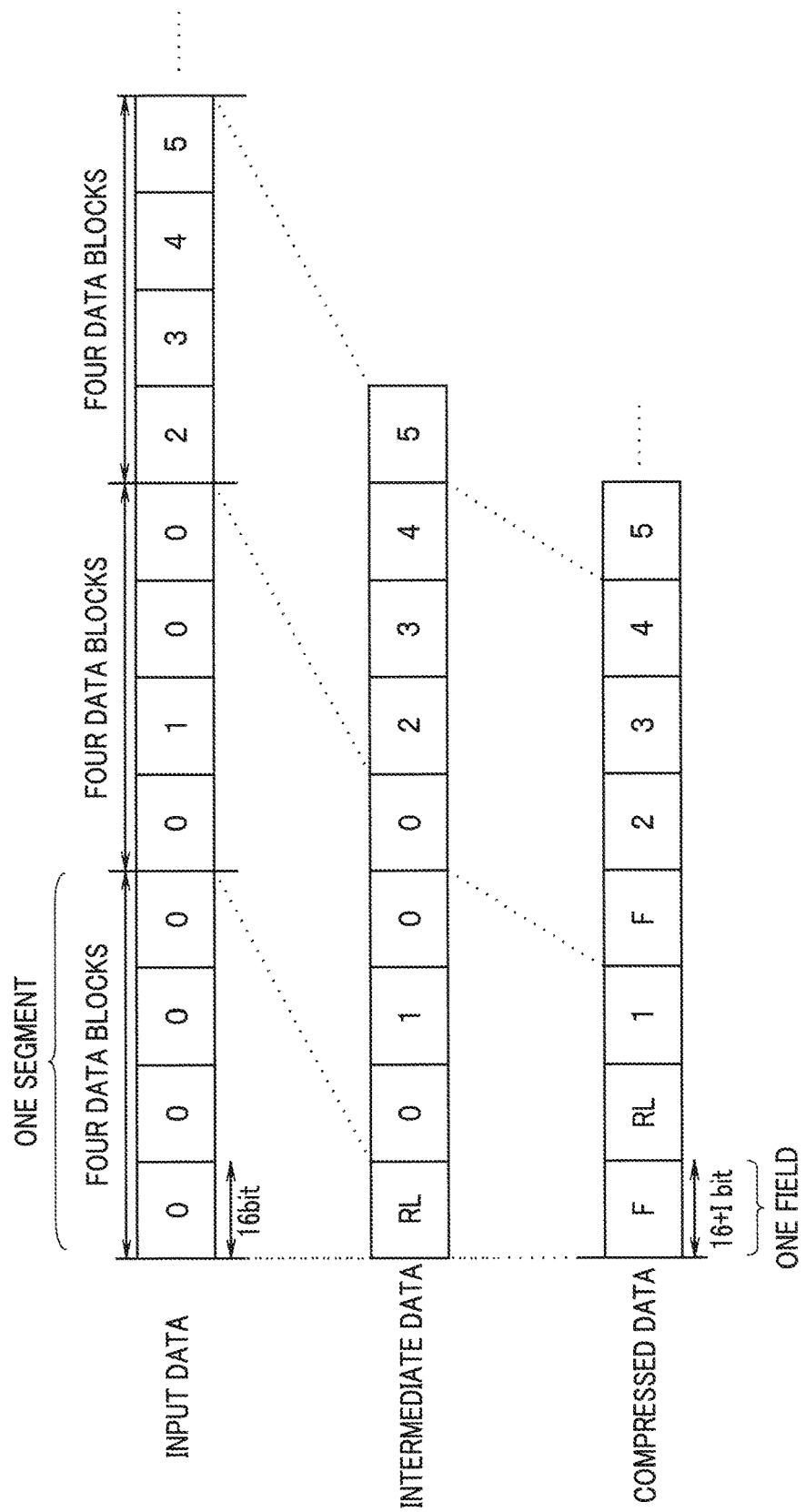
FIG. 11 is an explanatory diagram of respective data structures of input data, intermediate data, and compressed data.

FIG. 11 is an explanatory diagram of respective data structures of input data, intermediate data, and compressed data. FIG. 11 shows a case where four data blocks or four symbols are defined as one segment, and compression is executed on each segment. Since all the values of data blocks in the first segment of the input data are "0", the first compressor 51 compresses the segment by the run length system. Since the second and third segments include data blocks other than "0", the segments are not compressed at the first compressor 51.

Thus, four data blocks are first compressed by the run length system into one 16+I-bit symbol and outputted as intermediate data. Subsequently, eight symbols each obtained by adding an I-bit adjustment bit to the head of each of data blocks are outputted. That is, twelve data blocks are compressed into nine symbols and the nine symbols are outputted.

Next, since the second and fourth symbols in the first segment of the intermediate data are each "0", the segment is compressed by the flag system. Since the first symbol of the second segment is "0", the segment is compressed by the flag system. The ninth symbol is subjected to compression (here, the non-compression) according to the value of a subsequent symbol.

Accordingly, the head field is outputted as compressed data of the first segment, and is followed by the fields "RL" and "1". Note that "RL" represents compression and generation by the run-length-system. That is, four symbols are compressed by the flag system so that three fields are outputted.

Next, a head field is outputted as the compressed data of the second segment, is followed by data blocks "2", "3", "4", and at last, the ninth non-compressed symbol, in which the I-bit section at the head has been converted into an identifier for identifying the non-compression, is outputted as one-field compressed data.

Figure 12:
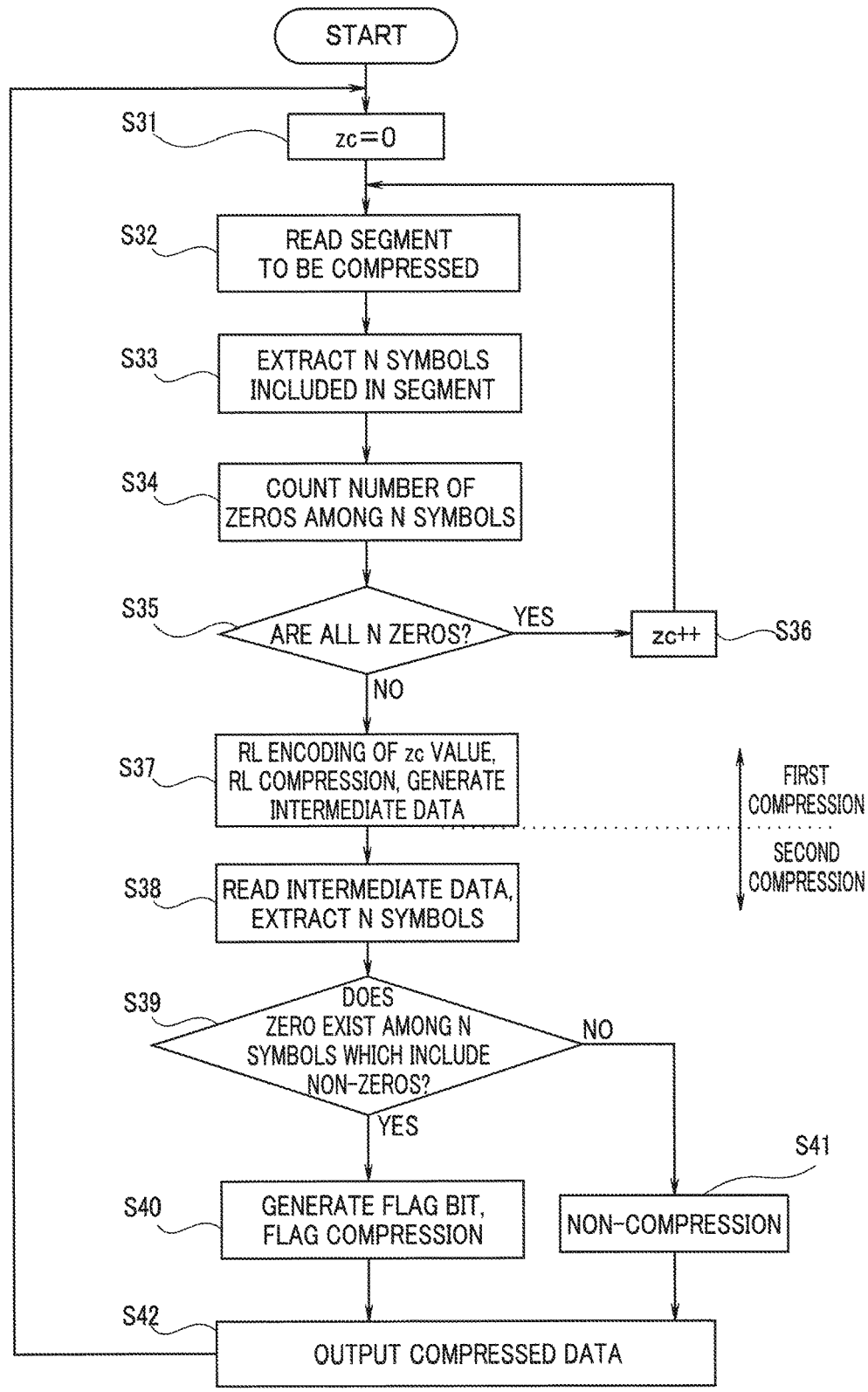
FIG. 12 is a flowchart showing an operation of the compressing device according to the second embodiment.

Next, an operation of the compressing device according to the present embodiment is described. FIG. 12 is a flowchart showing an operation of the compressing device according to the second embodiment. Note that it is assumed that a value as specific data to be compressed is registered in the compressing device before compression is executed. A description is given below of a case where "0" is registered as the specific data.

First, the value of the counter 512a is cleared to zero (zc=0 at S31). Next, one segment of input data is read into the first compressor 51 (S32). The data cutting unit 511 cuts out N data blocks configuring the one segment data, and outputs the N data blocks to the compression-method determining unit 512 (S33).

The compression-method determining unit 512 counts the number of data blocks each having a value "0" among the N data blocks (S34). When all the values of the N data blocks are "0" (YES at S35), the value of the counter 512a is incremented by one (S36), and the first compressor 51 returns to S32 and reads a next segment of the input data.

In contrast, when a data block having a value other than "0" is included in the N data blocks (S35 at NO), the RL compression unit 514 generates compressed data having a run length value which is equal to the value of the counter 512a and outputs the compressed data as intermediate data. Further, the non-compression unit 515 adds I-bit (for example, "0") for bit width adjustment to the head of each of the N data blocks, and outputs the resultant data as intermediate data (S37). The above processing sequence of S31 to S37 is executed in the first compressor 51.

Next, one segment of the intermediate data is read into the second compressor 52. The data cutting unit 521 cuts out N symbols configuring the one data segment, and outputs the N symbols to the compression-method determining unit 522 (S38). The compression-method determining unit 522 determines whether or not a symbol having a value "0" exists among the N symbols (S39). When a data block having a value "0" exists (YES at S39), the flag compression unit 524 creates a flag bit from the data of the segment and executes flag compression (S40), and outputs the resultant data as compressed data (S42).

In contrast, when a symbol having a value "0" does not exist (NO at S39), the non-compression unit 525 executes non-compression processing (processing for replacing an adjustment bit at the head of a symbol with an identifier indicating the non-compression) (S41), and outputs the resultant data as compressed data (S42). The above processing sequence of S38 to S42 is executed in the second compressor 52.

After output of the compressed data is completed, the operation returns to S31, the counter 512a is cleared to zero, and then, a next segment of the input data is read. In this way, until input of data to the compressing device 5 is ended, the sequential operation of S31 to S41 is repeated, so that the compressed data is generated and outputted.

Note that although the case where the compressing device is realized on hardware has been described above, the compression operation shown in FIG. 12 may be implemented by use of software.

Figure 13:
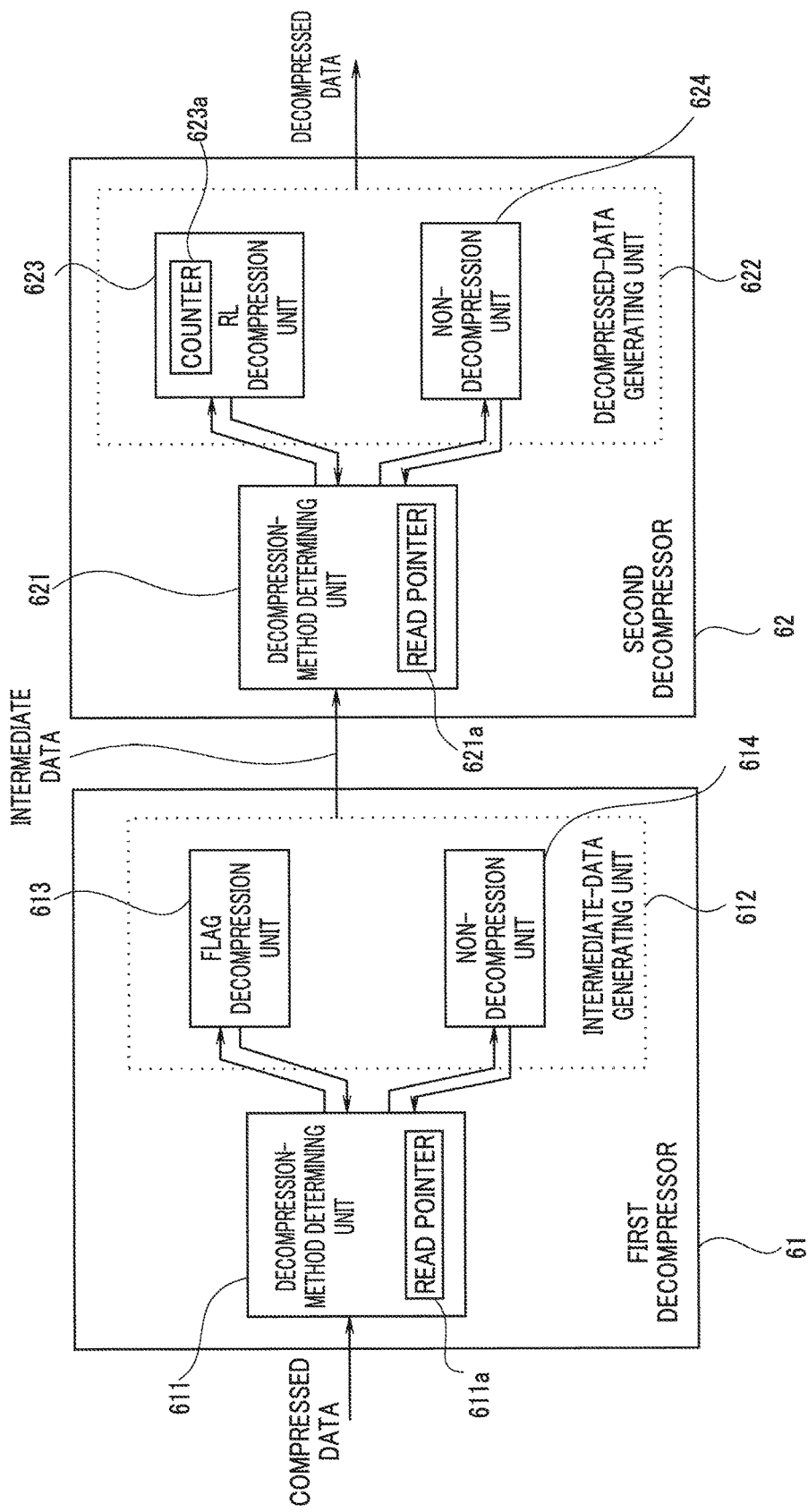
FIG. 13 is an explanatory diagram of the configuration of a decompressing device according to the second embodiment.

Next, a decompressing device 6 that decompresses the compressed data generated by use of the compressing device 5 according to the second embodiment is described. FIG. 13 is an explanatory diagram of the configuration of the decompressing device according to the second embodiment. The decompressing device 6 decompresses the compressed data in units of fields outputted at every I+W-bit from the data, and outputs the decompressed data. The decompressing device 6 is configured by a first decompressor 61 and a second decompressor 62. The first decompressor 61 generates intermediate data from the compressed data and outputs the intermediate data to the second decompressor 62. The second decompressor 62 generates decompressed data from the intermediate data and outputs the decompressed data.

The first decompressor 61 is configured by including a decompression-method determining unit 611 and an intermediate-data generating unit 612. The decompression-method determining unit 611 includes a read pointer 611a for pointing at the position of a field for which a decompression method is to be determined. The identifier of a field pointed at by the read pointer 611*a* is determined to indicate the flag system, the field is inputted into the flag decompression unit 613. The flag decompression unit 613 analyzes a flag bit stored in the field and determines the number of fields to be used for decompression. Subsequently, the flag decompression unit 613 requests fields from the decompression-method determining unit 611 such that the number of the fields is equal to the number of fields having flag bits "0". The decompression-method determining unit 611 advances the read pointer 611*a* by the number of fields to be used for decompression.

The decompression-method determining unit 611 outputs the requested number of fields to the flag decompression unit 613. In accordance with the flag bit stored in the head field, the flag decompression unit 613 outputs "0" when the flag bit shows "1" and outputs a value of a subsequent field when the flag bit shows "0".

For example, when a flag bit shows "0101" and the subsequent fields inputted as compressed data show "RL" and "3", four symbols "RL", "0", "3", "0" are outputted as intermediate data. The symbol "RL" compressed and generated by the run length system is treated as non-zero during the flag decompression. Note that the symbols in the intermediate data are each generated in 16+I-bit segments.

When the decompression-method determining unit 611 determines that the identifier indicates the non-compression, the field is inputted to the non-decompression unit 614. The non-decompression unit 614 outputs, as intermediate data, the inputted field as it is. The decompression-method determining unit 611 advances the read pointer 611*a* by the number of fields (=N fields) used for the processing.

The second decompressor 62 is configured by including a decompression-method determining unit 621 and a decompressed-data generating unit 622. The decompression-method determining unit 621 includes a read pointer 621*a* for pointing at the position of a symbol for which a decompression method is to be determined. When the identifier of a symbol pointed at by the read pointer 621*a* is determined to indicate the run length system, the symbol is inputted to the RL decompression unit 623. The RL decompression unit 623 generates decompressed data on the basis of a run length value stored in the symbol. The decompression-method determining unit 621 advances the read pointer 621*a* by the number of symbols (=one symbol) used for decompression.

When the decompression-method determining unit 621 determines that the identifier of the symbol indicates the non-compression, the symbol is inputted to the non-decompression unit 624. The non-decompression unit 624 deletes the I-bit identifier at the head and outputs the resultant data as W-bit decompressed data. The decompression-method determining unit 621 advances the read pointer 621*a* by the number of symbols (=N symbols) used for the processing.

That is, the decompressing device 6 according to the present embodiment executes decompression processing by the flag system and decompression processing by the run length system in stages at different decompressors. This enables reduction in the number of head-field analysis patterns for compressed data. Therefore, decompression processing can be executed with a higher operating frequency.

Figure 14:
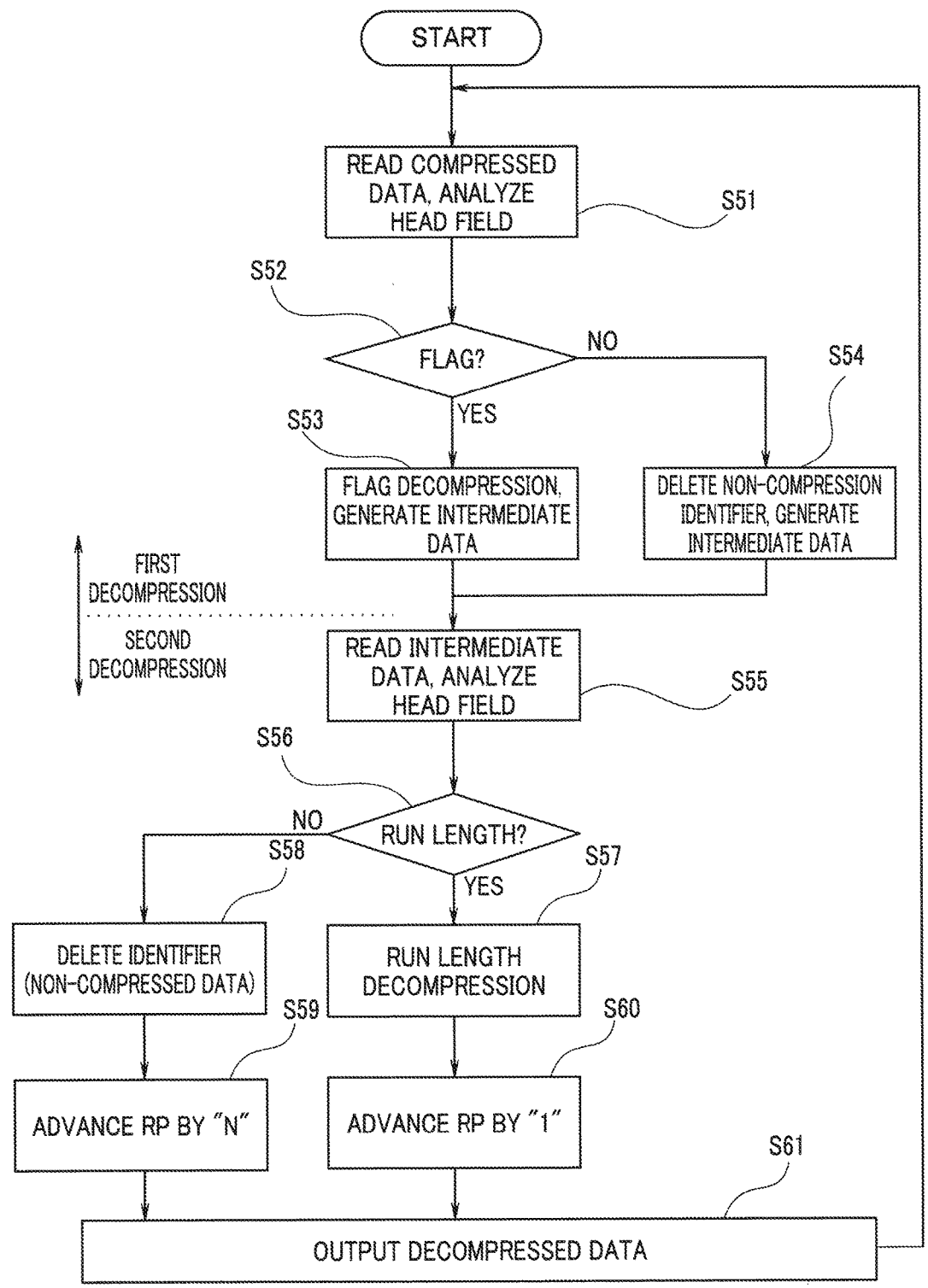
FIG. 14 is a flowchart showing an operation of the decompressing device according to the second embodiment.

Next, an operation of the decompressing device according to the present embodiment is described. FIG. 14 is a flowchart showing an operation of the decompressing device according to the second embodiment. Note that it is assumed that a value as specific data to be decompressed is registered in the decompressing device before data decompression is executed. In addition, it is assumed that the read pointers 611*a* and 621*a* point at the head field of compressed data and the head field of intermediated data, respectively. A description is given below of a case where "0" is registered as the specific data.

First, the read pointer 611*a* is checked, the head field of compressed data to be decompressed is read into the first decompressor 61, and an identifier given to the field is analyzed (S51). When the identifier indicates the flag system (YES at S52), the flag decompression unit 613 flag-decompresses the field and outputs the resultant field as intermediate data. In addition, the decompression-method determining unit 611 advances the read pointer 611*a* by the number of fields (the number of flag bits "0"+1) used for the flag decompression (S53).

When the identifier is determined not to indicate the flag system (NO at S52), the field is outputted, as intermediate data, as it is through the non-decompression unit 614. The decompression-method determining unit 611 advances the read pointer 611*a* by N (S54). The sequential procedures S51 to S54 are executed in the first decompressor 61.

Next, the read pointer 621*a* is checked, a symbol of the intermediate data is read into the second decompressor 62, and an identifier added to the symbol is analyzed (S55). When the identifier is determined to indicate the run length system (YES at S56), the RL decompression unit 623 run-length-decompresses the symbol and generates decompressed data (S57). In addition, the decompression-method determining unit 611 advances the read pointer 621*a* by one (S60) and outputs the decompressed data (S61).

When the identifier is determined not to indicate the run length system (NO at S56), the symbol is determined to be non-compressed. The non-decompression unit 624 deletes the I-bit head from the symbol and generates decompressed data (S58). In addition, the decompression-method determining unit 621 advances the read pointer 621*a* by N (S59), and outputs the decompressed data (S61). The above sequential procedures S55 to S61 are executed in the second decompressor 62.

After the decompressed data is outputted from the decompressed-data generating unit 622, the operation returns to S51, and a field pointed at by the read pointer 611*a* is analyzed. In this way, until input of data to the decompressing device 6 is ended, the operation sequence of S51 to S61 is repeated, so that the decompressed data is generated and outputted.

Note that although a case where the decompressing device is realized on hardware has been described above, the decompression operation shown in FIG. 14 may be implemented by use of software, as in the compressing device.

According to the present embodiment as described above, compression is executed in two stages using the run length system and the flag system. Accordingly, also decompression processing can be executed in stages using the flag system and the run length system at the different decompressors. This enables reduction in the number of field analysis patterns for compressed data. Therefore, the decompression processing can be executed with a higher operating frequency.

Note that various modifications of the compressed data format can be made as long as a field having a fixed length and a compression method by which the compressed data is compressed can be identified by checking a particular position in the compressed data. For example, in the head field by flag-compression as shown in FIG. 8, the number of non-zero data blocks may be stored in a (W−N)-bit reserved bit section. Further, as shown in FIG. 9, when a format of input data is defined in advance, the compression systems are allocated to respective specific bit patterns, such that compression processing is executed without adding an identifier for a compression system. A specific method for identifying a compression method at a time of decompression is changed depending on variations in the compressed data format.

The respective "units" herein refer to concepts corresponding to the respective functions in each of the embodiments, and do not necessarily correspond to particular hardware or software routines on one-to-one basis. Therefore, the description assuming virtual circuit blocks (units) having the respective functions in each of the embodiments has been given herein.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A data compressing device comprising:
a processor configured to divide continuously inputted data into data blocks each having a first bit width and to output the data blocks by a predetermined number of the data blocks one by one as a segment;
a compression-selector configured to select each of the segments, first compression means, second compression means, or non-compression means according to a ratio of data blocks of data which is set in advance with respect to the data blocks included in the segment;
a first compression unit configured to execute, on any of the segments, the first compression means of storing a consecutive amount of the data which is set in advance into compressed data; and
a second compression unit configured to execute, on any of the segments, the second compression means of storing positional information of the data which is set in advance into the compressed data, wherein
the compressed data compressed in accordance with the means selected by the compression-selector has an identification bit from which the compression means can be identified.

2. The data compressing device according to claim 1, wherein
the compression-selector includes a first compression-selector and a second compression-selector, the first compression-selector selects the first compression means or the non-compression means, and the second compression-selector selects the second compression means or the non-compression means, and
intermediate data is generated by compression of one of the segments by the compression means selected by the first compression-selector, and the intermediate data is compressed by the compression means selected by the second compression-selector, whereby the compressed data is generated.

3. The data compressing device according to claim 1, wherein
the first compression means is compression by a run length method.

4. The data compressing device according to claim 1, wherein
the second compression unit stores, into the compressed data, positional information of the data which is set in advance and information about a number of the data blocks of data other than the data which is set in advance among the data blocks in the segment to be compressed.

5. The data compressing device according to claim 1, wherein
the data which is set in advance is zero.

6. The data compressing device according to claim 1, wherein
a data format of the data to be inputted is defined in advance, and data compressed by the first compression unit and data compressed by the second compression unit are allocated to respective particular patterns.

7. The data compressing device according to claim 6, wherein
a data format of the data to be inputted is a data format using IEEE754 half-precision floating-point expression.

8. A data decompressing device which decompresses compressed data including a plurality of continuously inputted fields each having a bit width, the data decompressing device comprising:
a processor configured to select first decompression means, second decompression means, or non-decompression means according to an identification bit which is included in each of the fields and from which compression means can be identified;
a first decompression unit configured to execute, on the compressed data, the first decompression means of outputting a data value which is set in advance or non-compressed data on the basis of positional information stored in the compressed data; and
a second decompression unit configured to execute, on the compressed data, the second decompression means of outputting the data value which is set in advance on the basis of a consecutive amount of the data value which is set in advance stored in the compressed data.

9. The data decompressing device according to claim 8, wherein
the decompression-selector includes a first decompression-selector and a second decompression-selector, the first decompression-selector selects the first decompression means or the non-decompression means, and the second decompression-selector selects the second decompression means or the non-decompression means, and
intermediate data is generated by decompression of each of the fields by the decompression means selected by the first decompression-selector, and the intermediate data is decompressed by the decompression means selected by the second decompression-selector, whereby the decompressed data is generated.

10. The data decompressing device according to claim 8, wherein
the second decompression means uses decompression by a run length method.

11. The data decompressing device according to claim 8, wherein
the data value which is set in advance is zero.

12. The data decompressing device according to claim 8, wherein
the first decompression unit specifies a number of the fields to be used for decompression, on the basis of information about a number of the data blocks of data other than the data value which is set in advance.

13. The data decompressing device according to claim 8, wherein
a data format of the decompressed data is defined in advance, and the compressed data is allocated to respective specific data patterns of data decompressed by the first decompression unit and data decompressed by the second decompression unit, and data decompressed by the first decompression unit and data decompressed by the second decompression unit are allocated to respective specific data patterns.

14. The data decompressing device according to claim 13, wherein
the data format of the compressed data is a data format using IEEE754 half-precision floating-point expression.

15. A data compressing/decompressing apparatus comprising:
a data compressing device comprising:
a first processor configured to divide continuously inputted data into data blocks each having a first bit width and to output the data blocks by a predetermined number of the data blocks one by one as a segment;
a compression-selector configured to select each of the segments, first compression means, second compression means, or non-compression means according to a ratio of data blocks of data which is set in advance with respect to the data blocks included in the segment;
a first compression unit configured to execute, on any of the segments, the first compression means of storing a consecutive amount of the data which is set in advance into compressed data; and
a second compression unit configured to execute, on any of the segments, the second compression means of storing positional information of the data which is set in advance into the compressed data, wherein
the compressed data compressed in accordance with the means selected by the compression-selector has an identification bit from which the compression means can be identified; and
a data decompressing device configured to decompress compressed data generated by the data compressing device, the compressed data including a plurality of continuously inputted fields each having a second bit width, comprising:
a second processor configured to select first decompression means, second decompression means, or non-decompression means according to the identification bit which is included in each of the fields and from which compression means can be identified;
a first decompression unit configured to execute, on the compressed data, the first decompression means of outputting the data which is sent in advance or non-compressed data on the basis of positional information stored in the compressed data; and
a second decompression unit configured to execute, on the compressed data, the second decompression means of outputting the data which is set in advance on the basis of a consecutive amount of the data which is set in advance stored in the compressed data.

16. The data compressing/decompressing apparatus according to claim 15, wherein
the compression-selector includes a first compression-selector and a second compression-selector, the first compression-selector selects the first compression means or the non-compression means, and the second compression-selector selects the second compression means or the non-compression means,
intermediate data is generated by compression of one of the segments by the compression means selected by the first compression-selector, and the intermediate data is compressed by the compression means selected by the second compression-selector, whereby the compressed data is generated,
the decompression-selector includes a first decompression-selector and a second decompression-selector, the first decompression-selector selects the first decompression means or the non-decompression means, and the second decompression-selector selects the second decompression means or the non-decompression means, and
intermediate data is generated by decompression of one of the fields by the decompression means selected by the first decompression-selector, and the intermediate data is decompressed by the decompression means selected by the second decompression-selector, whereby the decompressed data is generated.

17. The data compressing/decompressing apparatus according to claim 15, wherein
the first compression means is compression by a run length method, and the second decompression means uses decompression by the run length method.

18. The data compressing/decompressing apparatus according to claim 15, wherein
the data which is set in advance is zero.

19. The data compressing/decompressing apparatus according to claim 15, wherein
the second compression unit stores, into the compressed data, positional information of the specific data which is set in advance and information about a number of the data blocks of data other than the data which is set in advance among the data blocks in the segment to be compressed, and the first decompression unit specifies the number of fields to be used for decompression, on the basis of the information about the number of the data blocks of data other than the data which is set in advance.

20. The data compressing/decompressing apparatus according to claim 15, wherein
a data format for the data to be inputted is defined in advance, and data compressed by the first compression unit and data compressed by the second compression unit are allocated to respective specific data patterns.

* * * * *